(12) United States Patent
Tanaka et al.

(10) Patent No.: US 7,353,145 B2
(45) Date of Patent: Apr. 1, 2008

(54) METHOD FOR CORRECTING A MASK PATTERN, A COMPUTER PROGRAM PRODUCT, A METHOD FOR PRODUCING A PHOTOMASK, AND METHOD FOR MANUFACTURING A SEMICONDUCTOR DEVICE

(75) Inventors: Satoshi Tanaka, Kawasaki (JP); Soichi Inoue, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 707 days.

(21) Appl. No.: 10/307,968

(22) Filed: Dec. 3, 2002

(65) Prior Publication Data
US 2003/0140330 A1    Jul. 24, 2003

(30) Foreign Application Priority Data
Dec. 4, 2001    (JP)    ............... P2001-370365

(51) Int. Cl.
G06F 7/60    (2006.01)
G06F 17/50    (2006.01)
G05B 19/18    (2006.01)
G03F 1/00    (2006.01)

(52) U.S. Cl. ............... 703/2; 700/57; 716/19; 716/21; 430/5

(58) Field of Classification Search ............... 703/2; 716/19, 21; 430/5; 700/57
See application file for complete search history.

(56) References Cited

U.S. PATENT DOCUMENTS

| 5,825,647 | A | * | 10/1998 | Tsudaka | ............ 700/57 |
| 5,969,801 | A | * | 10/1999 | Tsudaka | ............ 355/55 |
| 6,078,640 | A | * | 6/2000 | Hasegawa et al. | ............ 378/34 |
| 6,221,539 | B1 | * | 4/2001 | Kotani et al. | ............ 430/5 |
| 6,243,855 | B1 | * | 6/2001 | Kobayashi et al. | ............ 716/19 |
| 6,291,113 | B1 | * | 9/2001 | Spence | ............ 430/5 |
| 6,421,820 | B1 | * | 7/2002 | Mansfield et al. | ............ 716/21 |
| 6,567,972 | B1 | * | 5/2003 | Tanaka et al. | ............ 716/21 |
| 6,617,083 | B2 | * | 9/2003 | Usui et al. | ............ 430/5 |

(Continued)

FOREIGN PATENT DOCUMENTS

| CN | 1164049 A | 11/1997 |
| JP | 10-133358 | 5/1998 |
| KR | 1998-033229 | 7/1998 |
| WO | WO 01/65315 A2 | 9/2001 |

OTHER PUBLICATIONS

Notification of the First Office Action issued by People's Republic of China Patent Office dated Sep. 3, 2004, in Chinese Appl. No. 02153879.4, and English-language translation thereof.

(Continued)

*Primary Examiner*—Kamini Shah
*Assistant Examiner*—Shambhavi Patel
(74) *Attorney, Agent, or Firm*—Finnegan, Henderson, Farabow, Garrett & Dunner, L.L.P.

(57) ABSTRACT

A computer implemented method for correcting a mask pattern, includes: preparing a designed mask pattern; obtaining a rough corrected mask pattern from the designed mask pattern by applying a rough correction; and obtaining a precision corrected mask pattern from the rough corrected mask pattern by applying a precision correction using a model based correction method with a precision model that simulates a transferred image of an exposure apparatus.

20 Claims, 9 Drawing Sheets

U.S. PATENT DOCUMENTS

| | | | |
|---|---|---|---|
| 6,622,296 B2* | 9/2003 | Hashimoto et al. | 716/19 |
| 6,785,878 B2* | 8/2004 | Soper et al. | 716/19 |
| 6,853,743 B2* | 2/2005 | Kotani et al. | 382/144 |
| 6,883,158 B1* | 4/2005 | Sandstrom et al. | 716/19 |

OTHER PUBLICATIONS

Kotani et al., "Mask Pattern Correction Method, Mask Pattern Creation System Using the Correction Method, and Computer-Readable Recording Medium"; U.S. Appl. No. 09/748,227, filed Dec. 27, 2000.

Tanaka et al., "Method and Apparatus for Correcting Mak Pattern, Mask Having Corrected Mask Pattern, and Storage Medium Storing Program for Executing the Method for Correcting Mask Pattern", U.S. Appl. No. 09/609,715, filed Jun. 30, 2000.

Pati et al., "Phase-Shifting Masks for Microlithography: Automated Design and Mask Requirements"; J. Opt. Soc. Am A/vol. 11, No. 9/ Sep. 1994, pp. 2438-2452.

Notification of Reason(s) for Refusal, issued by Korean Patent Office, mailed Feb. 15, 2005, in Korean Application No. 10-2002-0076135, and English-language translation thereof.

* cited by examiner

| S \ W | 0.16 ~ 0.20 | 0.20 ~ 0.70 | ・・・ |
|---|---|---|---|
| 0.16 ~ 0.20 | $X_1, Y_1$ | $X_2, Y_2$ | ・・・ |
| 0.20 ~ 0.30 | $X_3, Y_3$ | $X_4, Y_4$ | ・・・ |
| ⋮ | ⋮ | ⋮ | ⋮ |

METHOD FOR CORRECTING A MASK PATTERN, A COMPUTER PROGRAM PRODUCT, A METHOD FOR PRODUCING A PHOTOMASK, AND METHOD FOR MANUFACTURING A SEMICONDUCTOR DEVICE

CROSS REFERENCE TO RELATED APPLICATIONS

This application is based upon and claims the benefit of priority from prior Japanese Patent Application P2001-370365 filed on Dec. 4, 2001; the entire contents of which are incorporated by reference herein.

BACKGROUND OF THE INVENTION

1. Field of the Invention

The present invention relates to a method for correcting a mask pattern, a computer program product, a method for producing a photomask, and a method for manufacturing a semiconductor device. In particular, it relates to a correction of optical proximity effects.

2. Description of the Related Art

Accompanying the miniaturization of semiconductor devices in recent years, various lithography technologies have been developed making it now possible to obtain fine patterns. For instance, using modified illumination or a phase-shifting photomask, it has become possible to resolve patterns having a pattern dimension value normalized with an exposure light wavelength $\lambda$ and a numerical aperture NA of a projection optical system of well below 0.5.

Under such photolithography conditions, a phenomenon of being unable to transfer a mask pattern of a photomask onto a wafer as designed, namely the Optical Proximity Effect (OPE), has become apparent. Optical Proximity Correction (OPC), which is a technique for matching a pattern shape that is transferred onto a wafer, to the original design, has become important.

Through the introduction of the OPC technique, it has become possible to control variations in critical dimensions (CD) on the wafer. As a result, a fine pattern may be faithfully fabricated as designed on the wafer. Accordingly, the mask pattern on the photomask has become remarkably different from corresponding designed pattern on the wafer.

Until now, "a rule based correction method" and "a model based correction method" have been proposed as the OPC technique.

With the rule based correction method, mask pattern correction amounts corresponding to mask pattern placement are made into a rule table beforehand. Correction proceeds based on the mask pattern placement information while referencing the rule table. The rule table is normally produced through test results. With the rule based correction method, although the correction process is simple, it is difficult to generate all of the actual variations in circuit patterns into a rule table.

With the most simplified rule based correction method, the amount of correction is in accordance with a distance between neighboring mask patterns. With a general optical system, even though distances between mask patterns are the same, if line widths of the mask patterns differ, it has ben shown theoretically that light intensity distributions on the wafer are different during transfer. Accordingly, if the amount of correction is coordinated as a single-value function of the distance between the neighboring mask patterns, sufficient accuracy for the correction may not be possible.

Methods that complexify design rules in order to improve correction accuracy are also being studied. However, the number of rules increases with rule complexification and therefore the procedure for correction is also made more complicated. In addition, problems develop such as in deciding how the rules themselves should be obtained.

Meanwhile, the model based correction method predicts the shape that will be transferred onto the wafer based on mask pattern information and wafer process conditions; and then adds corrections to the mask pattern to obtain desired values. With the model based correction method, to begin with, evaluation points are allocated and edges are partitioned for input mask pattern data. Light intensity calculations on adjacent evaluation points are then performed and the amount of deviation from the transferred pattern edge location on the wafer is calculated. Then, the amount of mask pattern correction for each partitioned edge is found in accordance with the amount of deviation. The edges are then shifted, transforming the mask pattern. Deviation evaluation and mask pattern correction are then repeated on a post-transformation mask pattern. If the amount of deviation has been brought down below a certain level, correction is ended.

Here, it is important to decide how much shift to apply to the mask pattern in response to the amount of deviation. Although the mask pattern is normally only shifted by an amount proportional to the amount of deviation, it is not easy to set a proportionality coefficient. The amount of deviation of the transferred pattern on the wafer changes depending on the mask pattern shape. As a result, the deviation evaluation and the mask pattern correction is usually repeated several times.

Highly accurate correction becomes possible if the calculation of light intensity is performed for deviation evaluation using a precision model. However, using the precision model requires a long time for the deviation evaluation. Consequently, it takes a long time to perform the correction. In general, there are many cases where a rough model having low accuracy is used to implement a high speed calculation, sacrificing a certain degree of calculation accuracy.

As described above, while highly accurate correction may be carried out with the model based correction method using the precision model with a high accuracy, the time required for correction increases. Accordingly, it is difficult to obtain a desired level of correction accuracy within a practical length of correction time.

SUMMARY OF THE INVENTION

A first aspect of the present invention inheres in a computer implemented method for correcting a mask pattern, includes: preparing a designed mask pattern; obtaining a rough corrected mask pattern from the designed mask pattern by applying a rough correction; and obtaining a precision corrected mask pattern from the rough corrected mask pattern by applying a precision correction using a model based correction method with a precision model that simulates a transferred image of an exposure apparatus.

A second aspect of the present invention inheres in a computer program product configured to be executed by a computer, includes: instructions configured to prepare a designed mask pattern; instructions configured to obtain a rough corrected mask pattern from the designed mask pattern by applying a rough correction; and instructions configured to obtain a precision corrected mask pattern from the rough corrected mask pattern by applying a precision correction using a model based correction method with a precision model that simulates a transferred image of an exposure apparatus.

A third aspect of the present invention inheres in a method for producing a photomask, includes: preparing a designed mask pattern; obtaining a rough corrected mask pattern from the designed mask pattern by applying a rough correction; obtaining a precision corrected mask pattern from the rough corrected mask pattern by applying a precision correction through a model based correction method using a precision model that simulates a transferred image of an exposure apparatus; loading a mask blank into a lithography system; and transferring the precision corrected mask pattern on the mask blank.

A fourth aspect of the present invention inheres in a method for manufacturing a semiconductor device, includes: producing a photomask, the photomask includes, preparing a designed mask pattern, obtaining a rough corrected mask pattern from the designed mask pattern by applying a rough correction, obtaining a precision corrected mask pattern from the rough corrected mask pattern by applying a precision correction through a model based correction method using a precision model that simulates a transferred image of an exposure apparatus, loading a mask blank into a lithography system, and transferring the precision corrected mask pattern on the mask blank; loading a semiconductor substrate coated with a resist film into the exposure apparatus; projecting light through the photomask on the resist film so as to transfer the precision corrected mask pattern of the photomask on the resist film to form a resist pattern; and processing the semiconductor substrate using the resist pattern as a mask.

DETAILED DESCRIPTION OF THE INVENTION

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

Figure 1:
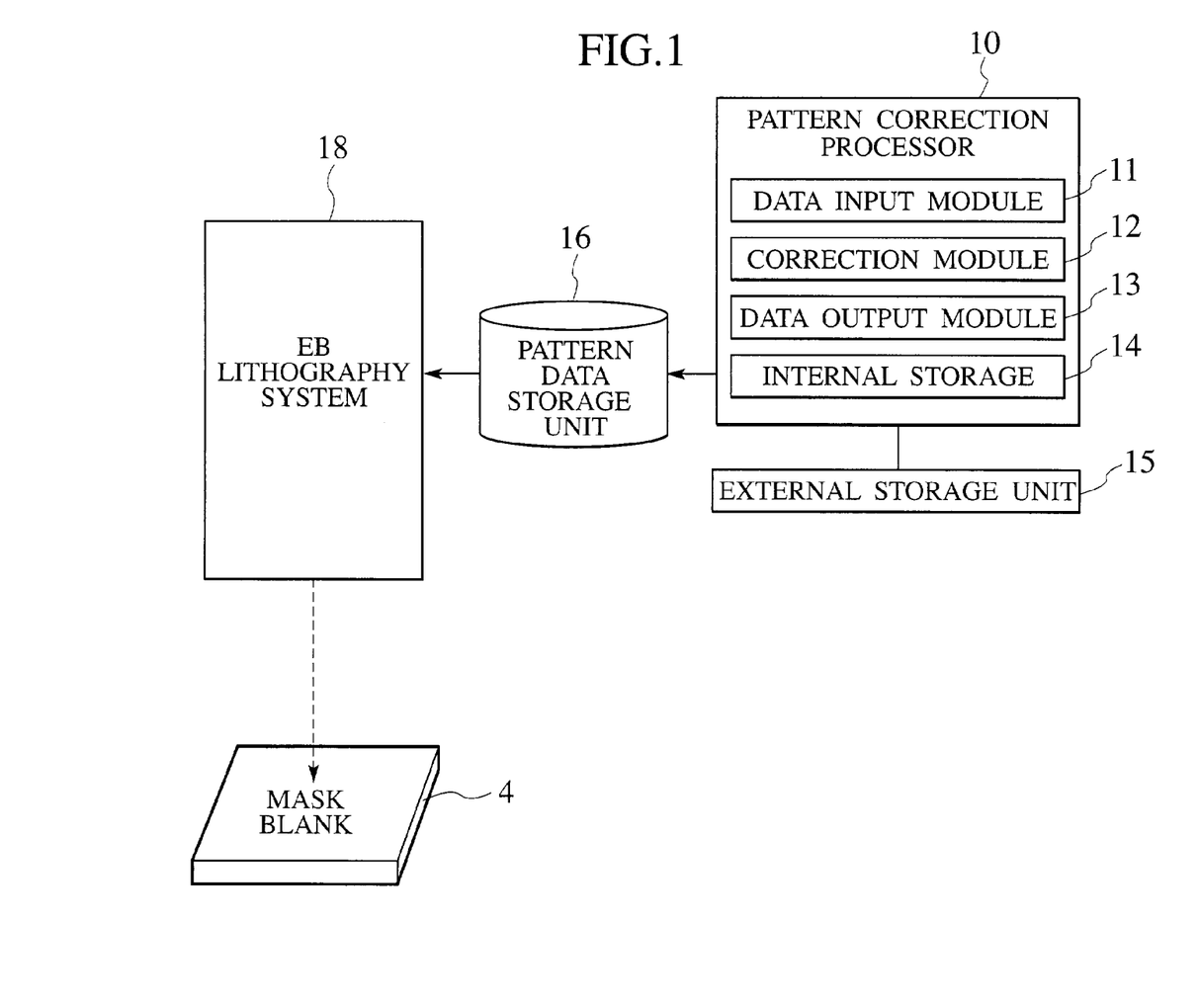
FIG. 1 is a diagram illustrating a lithography apparatus for implementing a correction method of a mask pattern according to a first embodiment of the present invention.

As shown in FIG. 1, a lithography apparatus according to a first embodiment of the present invention includes: a pattern correction processor 10 performing OPC on input designed mask pattern data and outputting corrected mask pattern data; an external storage unit 15 reading out OPC program codes stored on a memory medium and supplying the OPC program codes to the pattern correction processor 10; a pattern data storage unit 16 for acquiring the corrected mask pattern data from the pattern correction processor 10 as write data; and an electron beam (EB) lithography system 18 for writing a mask pattern on a mask blank 4 based on the corrected mask pattern data output from the pattern data storage unit 16.

The pattern correction processor 10 includes a data input module 11 acquiring the designed mask pattern data; a correction module 12 performing OPC on the designed mask pattern data; a data output module 13 outputting the corrected mask pattern data to the pattern data storage unit 16; and an internal storage 14 storing the program code for implementing OPC. The pattern correction processor 10 is realized with a central processing unit (CPU) of computers or the like. The OPC program implemented with the correction module 12 is read out from the internal storage 14. Alternatively, it is also allowable for the OPC program codes stored on the memory medium loaded into the external storage unit 15 to be read out.

In accordance with the write data, the EB lithography system 18 writes the mask pattern onto the mask blank 4 using an electron beam. For example, with a raster scan method, the mask pattern is transferred onto the mask blank 4 by scanning the electron beam in a fixed direction and turning the electron beam on and off according to the write data.

Figure 2A:
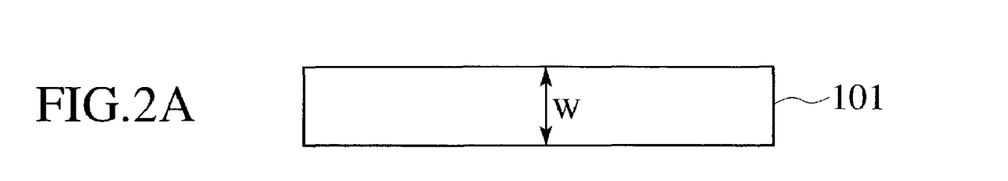
FIGS. 2A through 2C are pattern shape diagrams describing the correction method of the mask pattern.
Figure 2B:
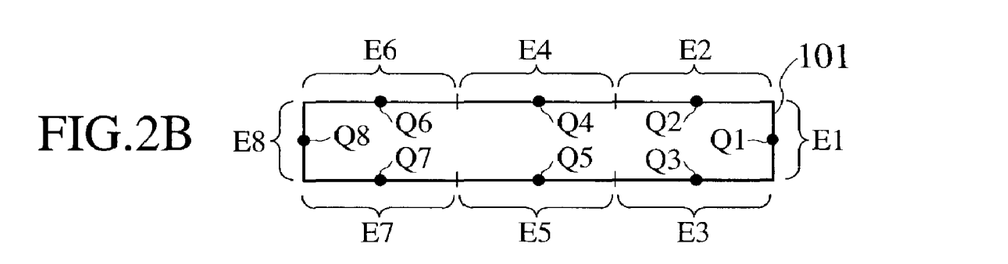
Figure 2C:
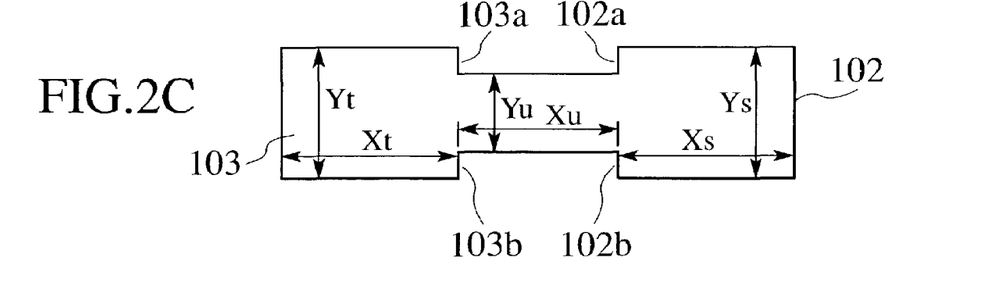

With the pattern correction processor 10 implementing a model based correction method according to the first embodiment, for instance as shown in FIG. 2A, a line pattern 101 having a line width W is input to the data input module 11 as the designed mask pattern data. As shown in FIG. 2B, along a perimeter of the line pattern 101, the allocation of evaluation points Q1 through Q8 and partitioning into edge segments E1 through E8 is performed with the correction module 12. A transferred pattern is simulated on the wafer at the evaluation points Q1 through Q8. In a case where there is little pattern adjacent to the line pattern 101, an OPE emerges strongly, and in particular ends in the longitudinal direction of the transferred pattern shrink. Accordingly, a shape of the corrected mask pattern, as shown in FIG. 2C, has serifs 102 and 103 that include jogs 102a, 102b and 103a, 103b, respectively, at the ends along the length of the line pattern 101. A serif length Xs of the serif 102 is longer than the edge segments E2 and E3 of the line pattern 101, and a serif width Ys is wider than the line width W of the edge segment E1. A serif length Xt of the serif 103 is longer than the edge segments E6 and E7 of the line pattern 101, and a serif width Yt is wider than the line width W of the edge segment E8. A length Xu of a center portion between the serifs 102 and 103 is the same length as the edge segments E4 and E5 of the line pattern 101, and a width Yu is substantially equal to the line width W. The corrected mask pattern is output from the data output module 13 and stored in the pattern data storage unit 16.

With the model based correction method according to the first embodiment, correction amounts are first found at each evaluation point by executing a correction calculation using a rough correction with a rough model obtained by simple approximation. After reaching convergence conditions in the rough correction, the correction calculation is again executed using a precision correction with a precision model with a rough correction result as an initial value.

The rough correction and the precision correction are carried out using similar loop processing. More specifically, a predicted transferred pattern is simulated upon the wafer through a calculation of a light intensity, using a setting calculation model. An amount of deviation between the predicted transferred pattern and the designed mask pattern is found and compared with a criterion. When the amount of deviation is larger than the criterion, processing returns to a stage simulating the predicted transferred pattern, repeating the loop processing until the amount of deviation is less than the criterion.

For the rough correction, the rough model defined by an approximate expression that sacrifices calculation accuracy but allows high-speed calculation is applied. On the other hand, for the precision correction, a precision model that requires more time but allows highly accurate processing is applied. The approximate expression used for the rough model has a smaller number of parameters than those for the computation expression used for the precision model. The rough correction allows simulation at a higher speed than the precision correction due to the smaller number of parameters.

A difference in dimensions between a designed pattern and a maximum value of a variation allowed for a semiconductor device performance in a fabricated pattern dimension, is defined as a "process-induced permissible dimension error (CD tolerance)". In particular, a contribution of the OPE to the process-induced permissible dimension error is defined as a "permissible dimension error". A calculation accuracy of the rough model is set lower than the permissible dimension error, and a rough criterion is set larger than the permissible dimension error. The calculation accuracy of the precision correction is several times higher than the permissible dimension error, and a precision criterion is set at the permissible dimension error.

With the first embodiment of the present invention, following application of the OPC using the rough correction, it is possible to shorten the length of time for highly accurate correction processing by implementing the precision correction.

Figure 3:
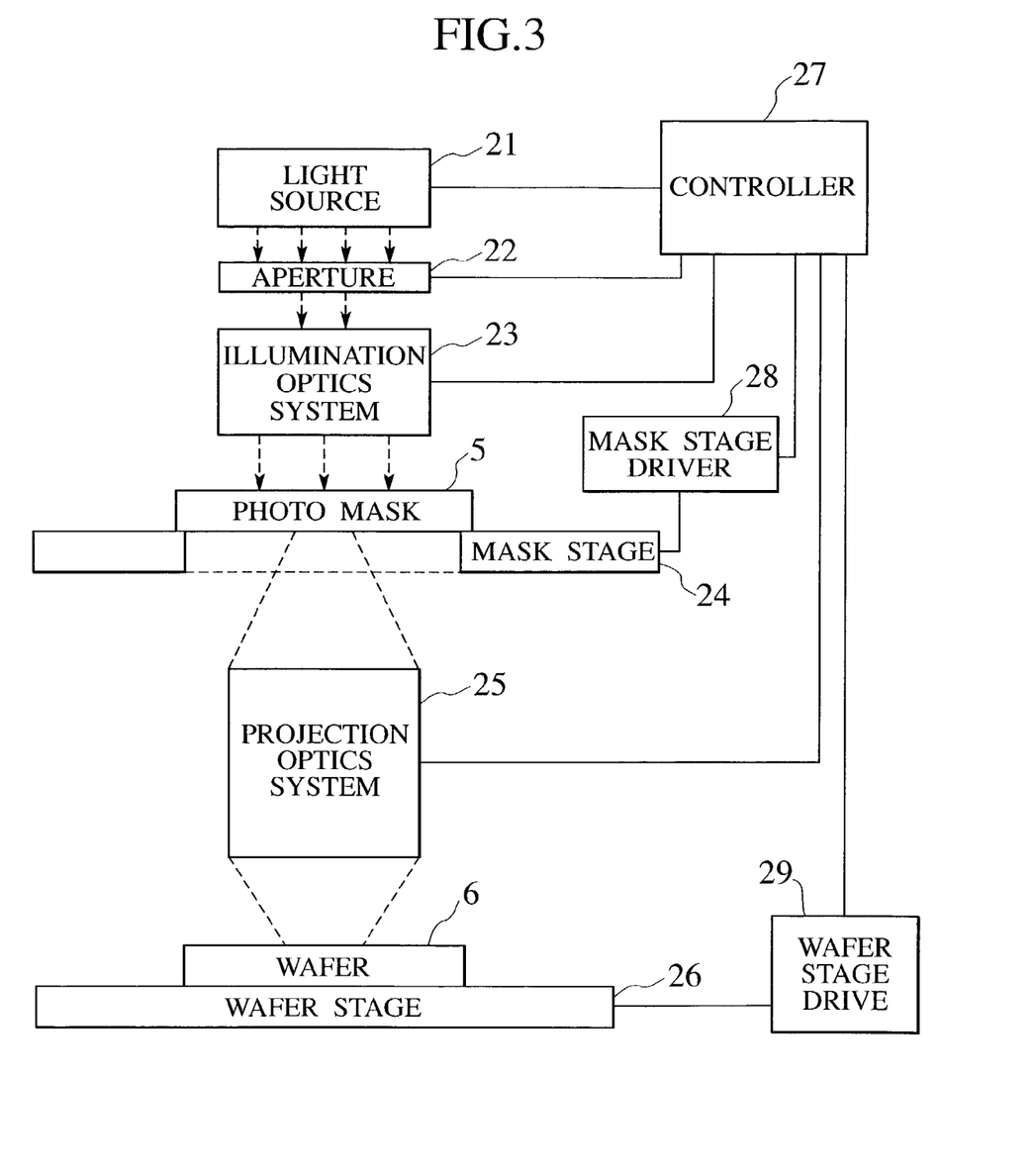
FIG. 3 is a schematic block diagram of an exposure apparatus used in the description of the first embodiment of the present invention.

In the model based correction method according to the first embodiment, an exposure apparatus used in the description of each model, as shown in FIG. 3, is assumed to be a scanning excimer laser reduced projection exposure apparatus having a reduction ratio of 1:4. It should be noted that the reduction ratio of the exposure apparatus is made 1:4 solely for the sake of convenience, and an arbitrary reduction ratio may naturally be allowed. In addition, a step-and-repeat exposure apparatus (stepper) or any other appropriate exposure apparatus may naturally be used as the exposure apparatus. A krypton fluoride (KrF) excimer laser having a wavelength $\lambda$ of 248 nm may be used as a light source 21, and exposure light directed from the light source 21 is incident to a photomask 5 through an aperture 22 and an illumination optics system 23. A projection optics system 25 causes an image of a mask pattern of the photomask 5 to be projected onto a wafer (semiconductor substrate) 6. The photomask 5 and the wafer 6 are disposed on a mask stage 24 and a wafer stage 26, respectively. The mask stage 24 and the wafer stage 26 are aligned along the optical axis so that the mask pattern of the photomask 5 is focused on the wafer 6. A controller 27 adjusts an amount of emitted light from the light source 21 based on preset data. The controller 27 also adjusts a resolution of a transferred pattern on the wafer 6, a depth of focus, aberration correction, etc., for the aperture 22, the illumination optics system 23, and the projection optics system 25. Moreover, the controller 27 drives the mask stage 26 and the wafer stage 24 with a mask stage drive 28 and a wafer stage drive 29, respectively, and exposes after positioning within a plane intersecting the optical axis. Here the wavelength of the light source 21 is given as $\lambda$, the numerical aperture of the lens of the projection optics 25 as NA, and the coherence factor of the optical system as $\sigma$.

As the precision model used in the precision correction, for example, a partially coherent imaging system is adopted, which is expressed as:

$$I(x, y) = F^{-1}\left\{ \int_{-\infty}^{\infty}\int_{-\infty}^{\infty}\int_{-\infty}^{\infty}\int_{-\infty}^{\infty} TCC(f, g; f', g') \cdot m(f, g) \cdot m^*(f', g') df dg df' dg' \right\} \quad (1)$$

wherein I(x,y) is an image intensity on the wafer 6, $F^{-1}\{\ \}$ is an inverse Fourier transform, TCC is a transmission cross coefficient, m is a diffractive ray distribution function obtained from the mask pattern, and m* is a conjugate complex function of m. In addition, (f,g) and (f',g') are spatial frequency coordinates of n-th and n'-th order diffractive rays.

The transmission cross coefficient TCC is found as a transfer function from a combination of the n-th and n'-th order diffractive rays, and is expressed as:

$$TCC(f, g; f', g') = \quad (2)$$
$$\int_{-\infty}^{\infty}\int_{-\infty}^{\infty} S(f'', g'') \cdot P(f + f'', g + g'') \cdot P^*(f' + f'', g' + g'') df'' dg''$$

wherein S is an effective light source distribution, P is a pupil function, and P* is a conjugate complex function of P.

If the effective light source distribution S for normal illumination optics system with the coherence factor $\sigma$ is $(f^2+g^2)^{1/2} \leq \sigma \cdot NA/\lambda$, then $$S(f,g)=1 \quad (3)$$

If not, then $$S(f,g)=0 \quad (4)$$

If the pupil function P expressing pupil shape in the projection optics system is $(f^2+g^2)^{1/2} \leq NA/\lambda$, then $$|P(f,g)|=1 \quad (5)$$

If not, then $$P(f,g)=0 \quad (6)$$

Figure 4:
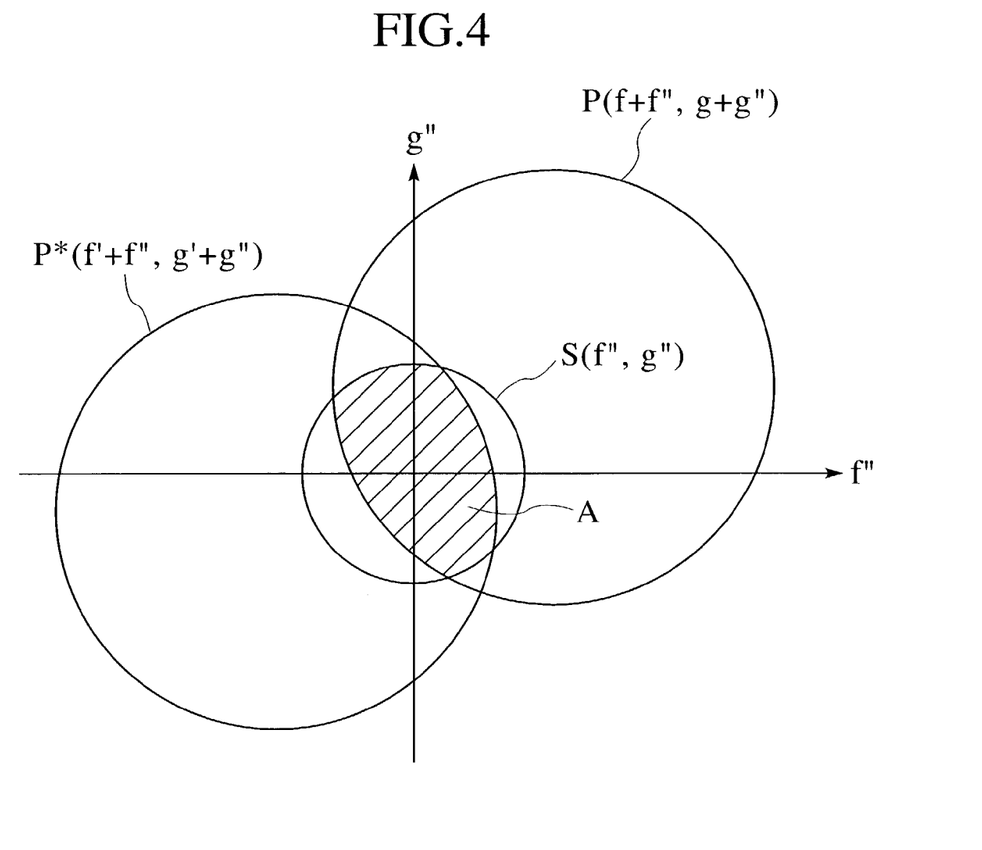
FIG. 4 is a diagram showing a range for integration to find an image intensity of a precision model.

Accordingly, a range of integration for finding the transmission cross coefficient TCC with expression (2) becomes, as shown in FIG. 4, region A, where the pupil functions $P(f+f'',g+g'')$ and $P^*(f'+f'',g'+g'')$ of the n-th and n'-th order diffractive rays overlap, further defined by the effective light source distribution $S(f'',g'')$.

In addition, the diffractive ray distribution function $m(f,g)$ is expressed as:

$$F^{-1}\{m(f,g)\}=m(x,y) \quad (7)$$

wherein $m(x,y)$ represents a complex amplitude transmissivity distribution of the mask pattern.

The precision correction finds the image intensity distribution on the wafer 6 through the model based correction method with the precision model, from equation (1). Then, in accordance with the image intensity obtained, a finished shape of the transferred pattern on the wafer 6 is calculated using a process simulation, such as a development simulation, an etching simulation and the like.

Meanwhile, for the rough model used in the rough correction, an imaging expression obtained by an eigenvalue expansion, for instance in accordance with an optimal coherent approximation (OCA) method described by Y. C. Pati, et al. (Journal of the Optical Society of America A, Vol. 11, No. 9, pp. 2438-2452, 1994), is adopted. Since the imaging expression in conformity with OCA is for the n-th order diffractive rays, it is expressed as:

$$I(x,y) = F^{-1}\left\{\sum_{k=0}^{M} \sigma_k [\phi_k \cdot m(f,g) \otimes (\phi_k \cdot m(f,g))^*]\right\} \quad (8)$$

wherein $\sigma_k$ is an eigenvalue upon optimal expansion of the TCC with an eigenfunction kernel $\Phi_k$ ($k=0, 1, 2, \ldots, M$), $\Phi_k$ is a Fourier transformed value of the eigenfunction kernel $\Phi_k$, and represents a correlation calculation.

The rough correction finds the image intensity distribution on the wafer 6 through the model based correction method with the rough model from equation (8), and then in accordance fxwith the image intensity obtained, finds the finished shape of the transferred pattern on the wafer 6.

Each length of processing time required for the precision correction with equation (1) and the rough correction with equation (8) is estimated. Equation (1) denotes integration over four variables: f, g, f', and g'; and equation (8) denotes integration over two variables: f and g. Numeric calculations for simulations are performed with an effective frequency range, for instance, divided by a certain N. Accordingly, a number of calculations, is approximately $N^4$ in the case of equation (1), and in the case of equation (8), is approximately $M \cdot N^2$. Normally, M ranges up to 8 and N ranges between 10 and 20, which means that the rough correction takes 1/10th the calculation time of the precision correction or less.

Figure 5:
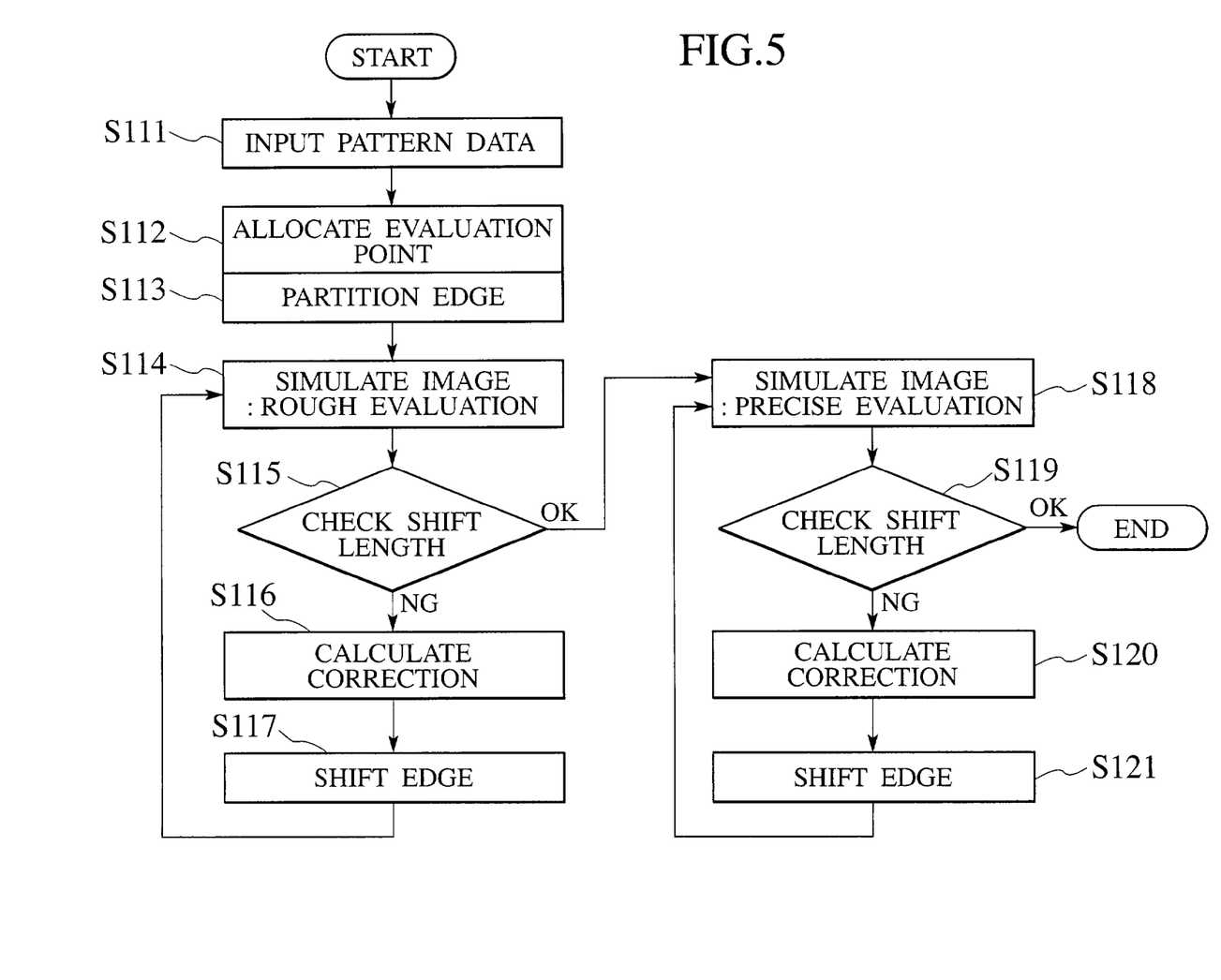
FIG. 5 is a flowchart showing an algorithm for the correction method of the mask pattern according to the first embodiment of the present invention.

Next, a correction method algorithm for the mask pattern according to the first embodiment of the present invention is described using a flowchart shown in FIG. 5, with reference to FIG. 6A through FIG. 6D.

Figure 6A:
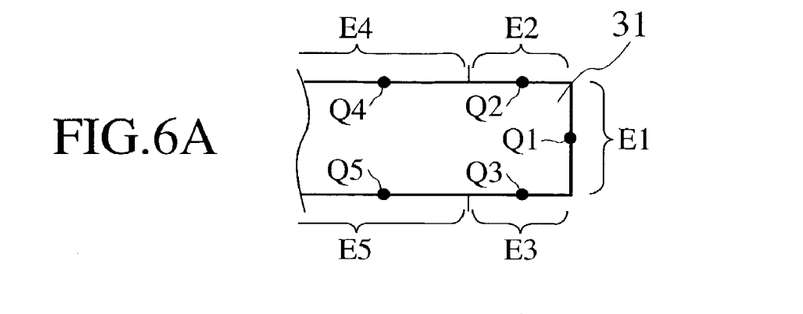
FIGS. 6A through 6D are pattern shape diagrams describing the correction method of the mask pattern according to the first embodiment of the present invention.

(a) To begin with, in step S111 of FIG. 5, a designed mask pattern 31, as shown in FIG. 6A, is input. In step S112, evaluation points Q1, Q2, ..., Q5, ... are allocated along an edge of the designed mask pattern 31, and in step 113, edge segments E1, E2, ..., E5, ... are partitioned to define the location of jog and serif generation.

Figure 6B:
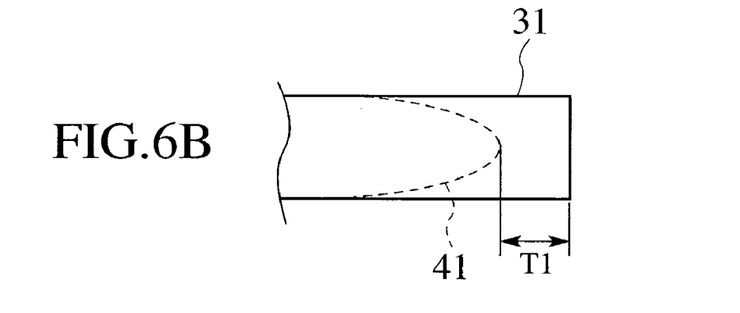
Figure 6C:
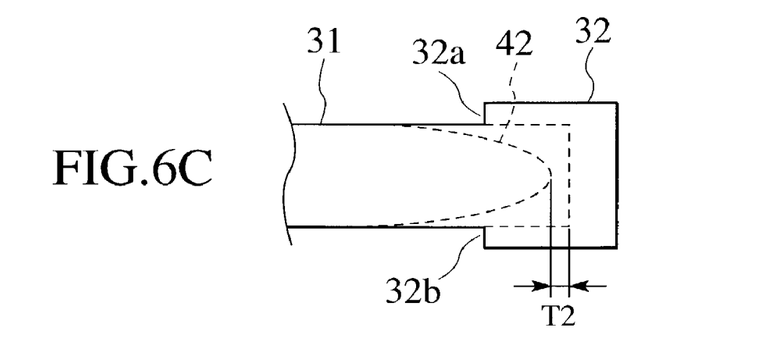
Figure 6D:
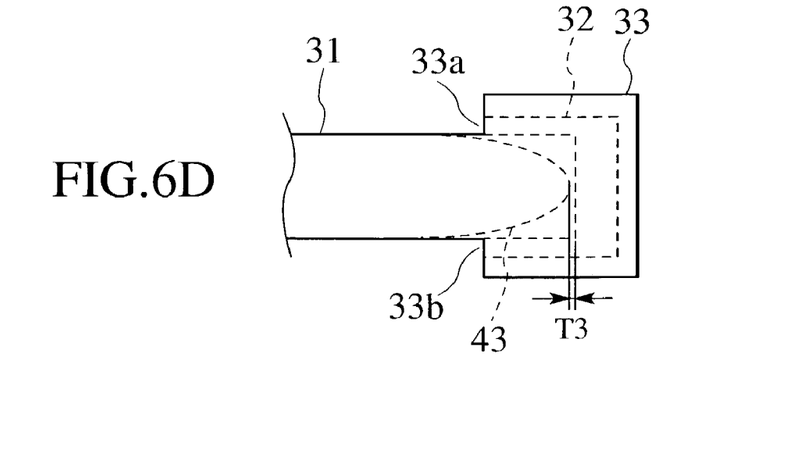

(b) Next, the rough correction is carried out with the model based correction method using the rough model. The rough criterion is set at several times, for instance 2 to 3 times, larger than the permissible dimension error. In step S114, the image intensity simulation is carried out at each of the evaluation points Q1, Q2, ..., Q5, ... in FIG. 6A using the rough model shown with equation (8), and then, as shown in FIG. 6B, a first amount of deviation T1 is calculated from the position of the edge segment E1 on the end of the designed mask pattern 31 to an end of a predicted transferred pattern 41. In step S115, the first amount of deviation T1 is compared with the rough criterion. If the first amount of diversion T1 is larger than the rough criterion, in step S116, a rough correction amount for the designed mask pattern 31 is found by multiplying the first amount of deviation T1 at edge segments E1, E2, and E3 with a correction coefficient found empirically. In accordance with the rough correction amount, in step S117, the edges are shifted to transform the designed mask pattern 31. Loop processing again returns to step S114 to perform simulation on a transformed mask pattern, and then in step S115, a second amount of deviation T2 to the predicted transferred pattern 42 is evaluated. If the second amount of deviation T2 is larger than the rough criterion level, the rough correction is repeated based on the second amount of deviation T2. If the second amount of deviation T2 has been brought down to below the rough criterion level, the rough correction ends. As a result, as shown in FIG. 6C, jogs 32a and 32b, and serif 32 are added to the end of the designed mask pattern 31. Loop processing again returns to step S114 to perform simulation on a transformed mask pattern, and then in step S115, a second amount of deviation T2 to the predicted transcription pattern 42 is evaluated. If the second amount of deviation T2 is larger than the rough criterion level, the rough correction is repeated based on the second amount of deviation T2. If the second amount of deviation T2 has been brought down to below the rough criterion level, the rough correction ends. As a result, as shown in FIG. 6C, jogs 32a and 32b, and serif 32 are added to the end of the designed mask pattern 31.

(c) Thereafter, using a rough corrected mask pattern data obtained after the rough correction as an initial value, precision correction is carried out with the model based correction method with the precision model. The precision criterion is set equal to the permissible dimension error. In step S118, the image intensity simulation is carried out at each of the evaluation points Q1, Q2, ..., Q5, ... using the precision model shown with equation (1), and a third amount of deviation T3 is calculated from the position of the edge segment E1 on the end of the designed mask pattern 31 to the end of the predicted transferred pattern 42. In step S119, the third amount of deviation T3 is compared with the precision criterion. If the third amount of deviation T3 is larger than the precision criterion level, in step S120, a precision correction amount is found in accordance with the third amount of deviation T3, and then in step S121, the edge of the serif 32 is shifted to transform the mask pattern. Processing again returns to step S118 to perform simulation on a transformed mask pattern, and then in step S119, the third amount of deviation T3 to the predicted transferred pattern is newly evaluated. If the new third amount of deviation T3 is larger than the precision criterion level, the precision correction is repeated based on the new third amount of deviation T3. Loop processing is repeated until the third amount of deviation T3 falls below the precision criterion, then as a result, as shown in FIG. 6C, jogs 33a and 33b, and serif 33 are added to the ends of the designed mask pattern data 31. In this manner, the predicted transferred pattern 43 is corrected to within the permissible dimension error.

Here, the first amount of deviation T1 prior to OPC implementation is larger than the permissible dimension error, or in other words, the precision criterion. The second amount of deviation T2 eventually obtained through the rough correction is brought to below than the rough criterion, or in other words, lower than a value of two or three times the precision criterion level. The third amount of deviation eventually obtained through the precision correction is kept within the precision criterion. Accordingly, relation for the first through the third amounts of deviation becomes T3>>T2>T1.

With the mask pattern correction method according to the first embodiment of the present invention, the rough corrected mask pattern data obtained using the rough correction is applied as the initial value for the precision correction. Accordingly, the correction processing time is the sum of the rough correction time and the precision correction time. As described above, the rough correction time is shorter, equal to or less than one-tenth the precision correction time. On the other hand, the rough correction has inferior correction accuracy in comparison with the precision correction. If the rough criterion were to be set to the precision criterion, which is the permissible dimension error, the number of rough correction iterations would increase, requiring longer time. Conversely, if the rough criterion were to be made too lax, shortening of the subsequent precision correction time would not be possible. Therefore, the rough criterion level is set approximately several times larger than the precision criterion. In addition, the rough criterion may be set so that the number of iterations of precision correction performed with the rough corrected mask pattern having the second amount of deviation T2 as the initial value is lower than the number of iterations for performing OPC using only the precision correction. For instance, when OPC is performed using only the precision correction, the iterations are between 10 and 20. If the rough criterion level is set to between two and three times that of the precision criterion, then the rough correction and the precision correction iterations fall within 10 times and 1-2 times, respectively. Accordingly, the total correction processing time for the first embodiment is less than one-tenth compared with that using only the precision correction.

With the first embodiment of the present invention, since the precision correction is performed using the rough corrected mask pattern obtained through the rough correction as the initial value, it is possible to reduce the amount of processing time necessary to obtain high correction accuracy.

Figure 7A:
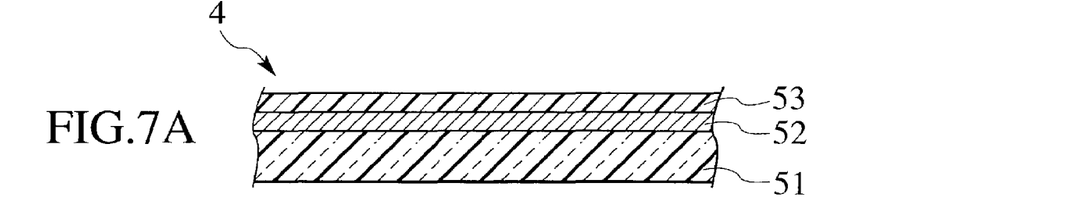
FIGS. 7A through 7C are cross-sectional process diagrams for producing a photomask according to the first embodiment of the present invention.
Figure 7B:
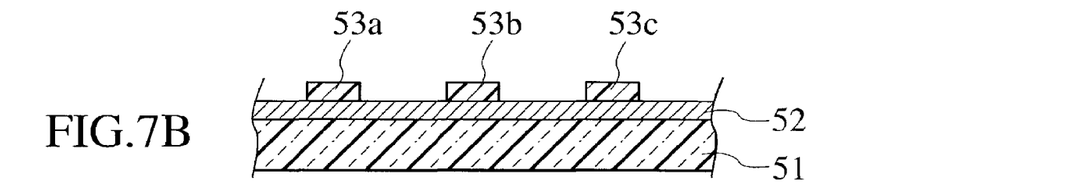
Figure 7C:
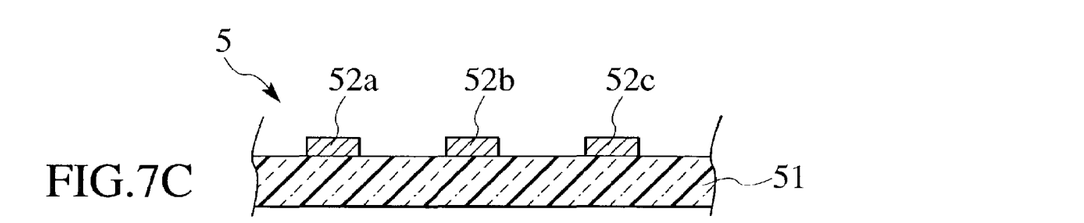

A method for correcting the mask pattern according to the first embodiment of the present invention is described in accordance with cross-sectional process diagrams shown in FIG. 7A through FIG. 7C.

(a) To begin with, a mask blank 4 is loaded into the EB lithography system 18 shown in FIG. 1. As shown in FIG. 7A, the mask blank 4 has a resist film 53 coated onto an opaque film 52 deposited on a transparent substrate 51.

(b) As shown in FIG. 7B, the corrected mask pattern data corrected with the pattern correction processor 10 is transferred onto the resist film 53, forming resist masks 53a through 53c.

(c) Using the resist masks 53a through 53c as an etching mask, the opaque film 52 is etched using a reactive ion etching (RIE), and as shown in FIG. 7C, opaque portions 52a through 52c are formed.

In this manner, a photomask 5 is produced having a circuit pattern formed with the corrected mask pattern according to the first embodiment of the present invention.

A method for manufacturing a semiconductor device using the photomask 5 produced in the first embodiment of the present invention is described forthwith.

Figure 8A:
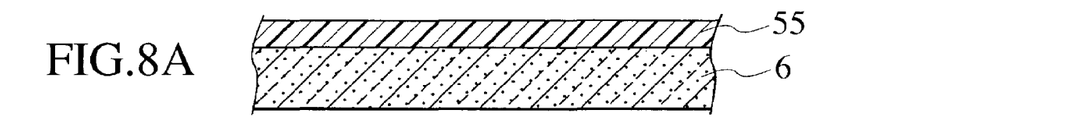
FIGS. 8A through 8C are cross-sectional process diagrams for manufacturing a semiconductor device according to the first embodiment of the present invention.

(a) To begin with, the photomask 5 is loaded on a mask stage of the exposure apparatus shown in FIG. 3. As shown in FIG. 8A, a wafer 6 coated a resist 55 is prepared and loaded onto the wafer stage 26.

Figure 8B:
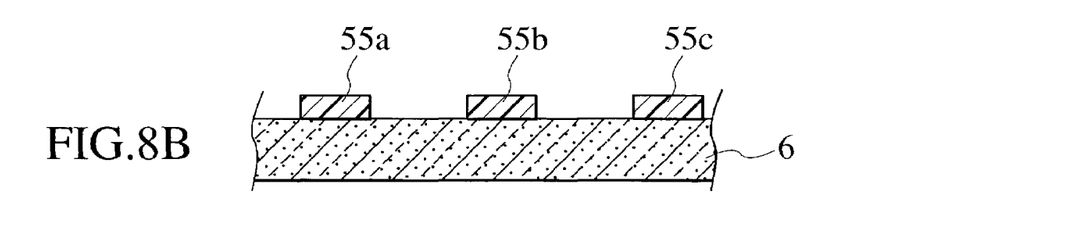

(b) As shown in FIG. 8B, circuit patterns of the photomask 5 are transferred onto the resist 55 by exposing, forming resist patterns 55a, 55b, and 55c.

Figure 8C:
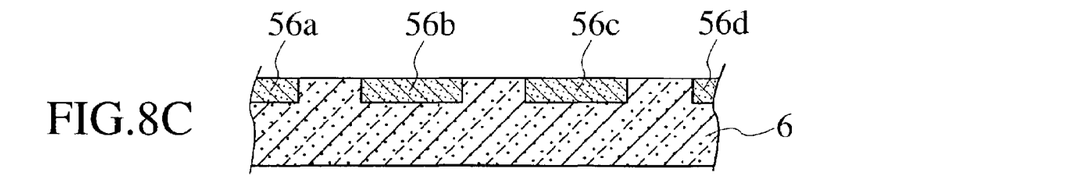

(c) Using the resist patterns 55a, 55b, and 55c as a mask, impurity doped layers 56a, 56b, 56c, 56d are selectively formed on the surface region of the wafer 6 using an ion implantation (I/I) method. Here, while a semiconductor device process using the I/I method as an example of impurity doping has been described, an impurity diffusion method or the like may be applied as the impurity doping method. In addition, other processes, for instance etching of the wafer 6 or foundation layers formed on the surface of the wafer 6, vapor deposition of metal layers, and sputtering of metal layers or insulating layers may naturally be used as well.

The circuit pattern processed using the photomask according to the first embodiment of the present invention is a more faithful reflection of the desired, designed pattern shape.

(Second Embodiment)

In a second embodiment of the present invention, a rough correction of a mask pattern correction method differs from that set forth in the first embodiment. With the mask pattern correction method according to the first embodiment, both the rough correction and the precision correction are model based correction methods. However, with the mask pattern correction method according to the second embodiment, rough correction using a rule based correction method is first performed, and then following completion thereof, precision correction is performed using a model based correction method.

Figure 9:
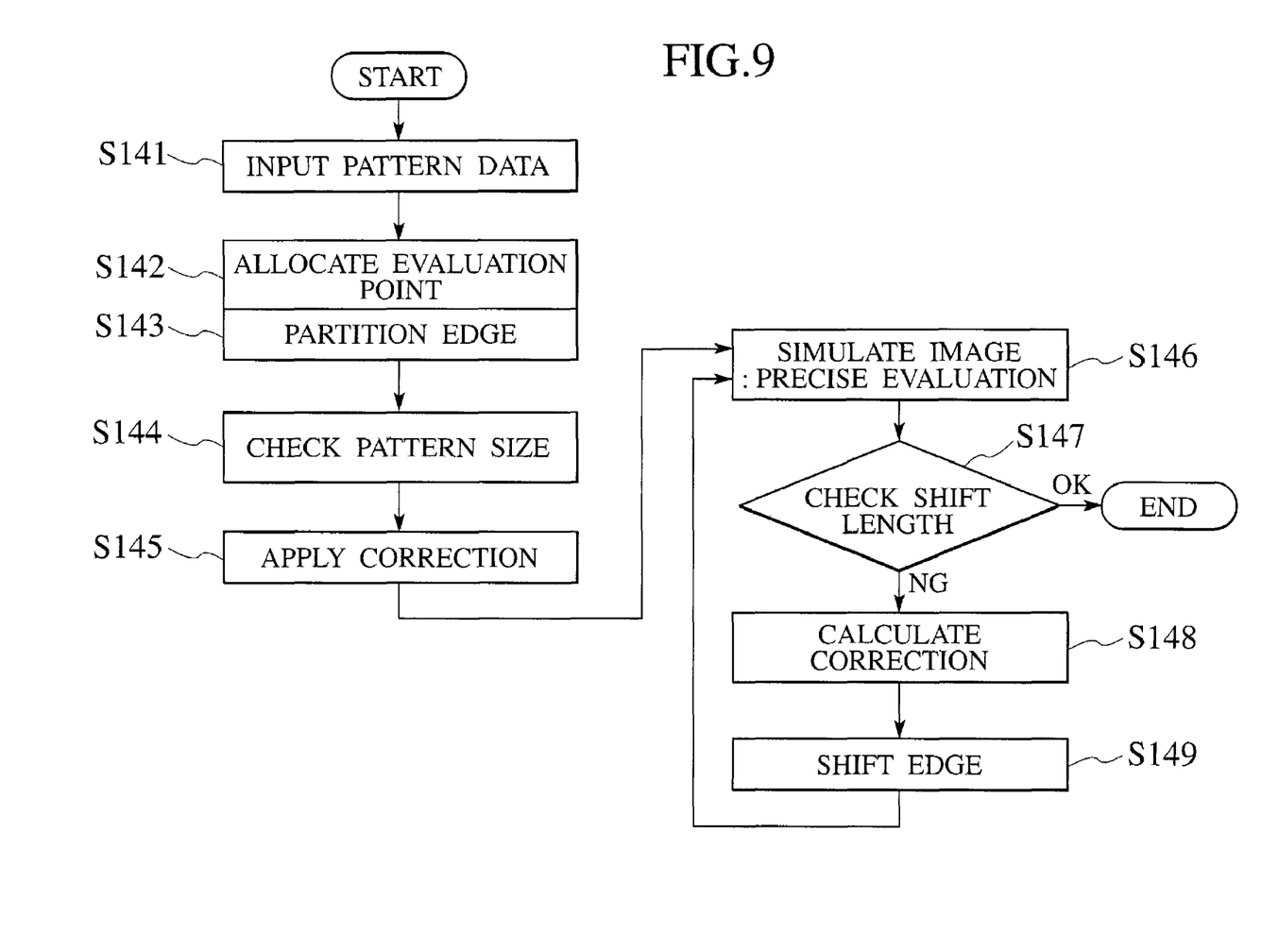
FIG. 9 is a flowchart showing an algorithm for a correction method of a mask pattern according to a second embodiment of the present invention.

Next, a mask pattern correction method algorithm according to the second embodiment of the present invention is described using a flowchart shown in FIG. 9, with reference to FIG. 10A through FIG. 10D and FIG. 11.

Figure 10A:
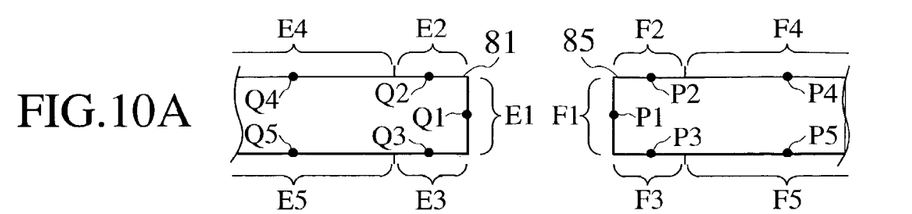
FIGS. 10A through 10D are pattern shape diagrams describing the correction method of the mask pattern according to the second embodiment of the present invention.

(a) To begin with, in step S141 of FIG. 9, designed mask patterns 81 and 85, as shown in FIG. 10A, are input. In step S142, along the edges of the designed mask patterns 81 and 85, evaluation points Q1, Q2, . . . , Q5, . . . , and P1, P2, . . . , P5, . . . , are allocated. Moreover, in step S143, in order to define the location where jogs and serifs are generated, the designed mask patterns 81 and 85 are subjected to partitioning into edge segments E1, E2, . . . , E5, . . . , and F1, F2, . . . , F5, . . .

Figure 10B:
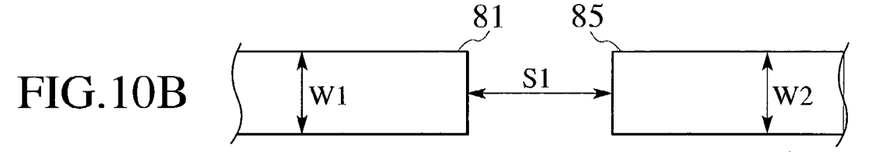
Figure 10C:
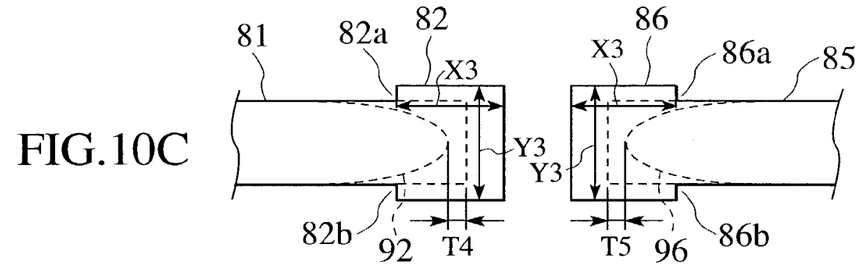

(b) Next, rough correction is carried out with the rule based correction method. In step S144, as shown in FIG. 10B, line widths W1 and W2 and a space width S1 of the designed mask pattern 81, 85 are checked. In step S145, the sizes of the serifs to be attached to the ends of the designed mask patterns 81 and 85 are selected from a rule table shown in FIG. 11. For example, if the line widths W1, W2 of the designed mask patterns 81, 85 are both 0.18 μm, and the space width S1 is made 0.3 μm, then the serif sizes for the mask patterns 81, 85 are set to (X3, Y3). Accordingly, as shown in FIG. 10C, at the edge segments E1, E2, and E3, and F1, F2, and F3 of the designed mask patterns 81 and 85, serifs 82 and 86 are added that include jogs 82*a* and 82*b*, and 86*a* and 86*b*.

Figure 10D:
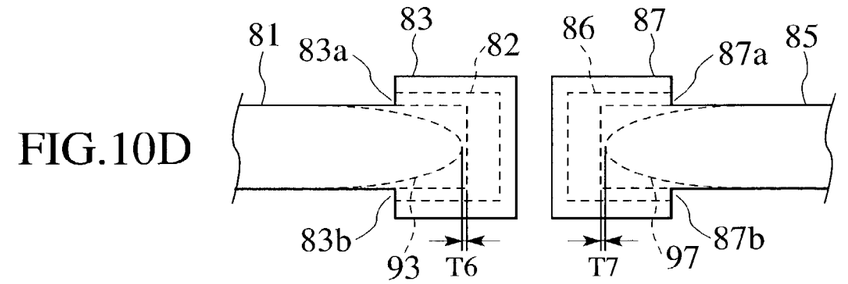
Figure 11:
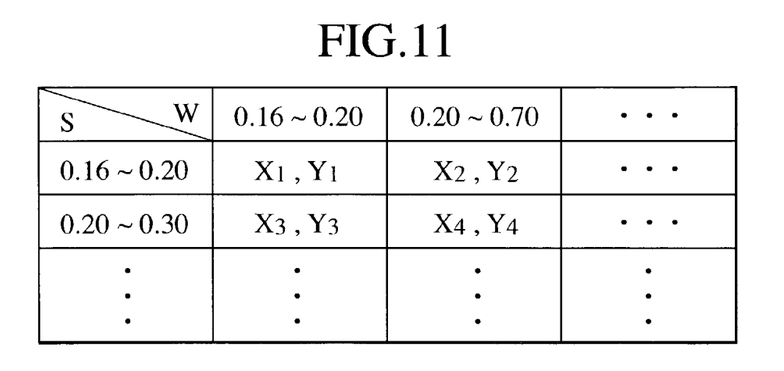
FIG. 11 shows a rule table according to the second embodiment of the present invention.

(c) Thereafter, using the rough corrected mask pattern data obtained through the rule based correction method as the initial value, the precision correction is carried out with the model based correction method using the precision model. In step S146, an image intensity simulation is carried out at each of the evaluation points Q1, Q2, . . . , Q5, . . . , and P1, P2, . . . , P5, . . . , and then as shown in FIG. 10C, fourth amounts of deviation T4 and T5 are calculated from the position of the edge segments E1 and F1 on the ends of the designed mask patterns 81 and 85 to the ends of predicted transferred patterns 92 and 96. In step S147, the fourth amounts of deviation T4 and T5 are compared with a precision criterion, which is the permissible dimension error. In the case where the fourth amounts of deviation T4 and T5 are greater than the precision criterion, in step S148, the amount of precision correction for the mask patterns is found in accordance with the fourth amounts of deviation T4 and T5, and then in step S149, the edges of the serifs 82 and 86 are shifted to transform the mask patterns. Newly corrected serifs are added to the designed mask patterns 81, 85. Loop processing again returns to step S146 to perform simulation on the transformed mask patterns, and then in step S147, the amount of deviation from the new predicted transferred patterns is evaluated. In the case where the evaluated amounts of deviation are larger than the precision criterion, precision correction is repeated based on the evaluated amount of deviation. Loop processing is repeated until the amounts of deviation become smaller than precision criterion. As a result, as shown in FIG. 10D, serifs 83 and 87 having jogs 83*a* and 83*b*, and 87*a* and 87*b* are added in order for the fifth amounts of deviation T6 and T7 from the ends of the designed mask patterns 81 and 86 to the ends of the predicted transferred patterns 93 and 97 to become smaller than the precision criterion.

In this manner, with the second embodiment of the present invention, since precision correction is performed using the rough corrected mask pattern data obtained by the rough correction with the rule based correction method as the initial value, it is possible to reduce the amount of processing time needed to obtain high correction accuracy.

Other Embodiments

With the first and second embodiments of the present invention, the imaging expression of the precision model is shown with scalar calculation. However, an even more precision corrected mask pattern may be obtained if simulation is performed using a model that finds the image intensity distribution through a depth of a resist film or a model that uses a vector imaging calculation.

In addition, while the lithography system for the mask pattern has been described with the EB lithography system, an x-ray lithography system or a short wavelength excimer laser lithography system may naturally also be used.

Various modifications will become possible for those skilled in the art after receiving the teachings of the present disclosure without departing from the scope thereof.

What is claimed is:

1. A computer implemented method for correcting a mask pattern, comprising:

preparing a designed pattern;

preparing first and second simulation models that simulate transferred images of an exposure apparatus, where a first simulation speed using the first simulation model is faster than a second simulation speed using the second simulation model for a given mask pattern and exposure apparatus condition;

creating a first mask pattern using data of the designed pattern;

obtaining a rough corrected mask pattern from the first mask pattern by applying a rough correction step including a first simulation step to obtain a first simulated pattern of the first mask pattern by using the first simulation model, and a first pattern modification step to modify the first mask pattern based on a first deviation amount between the designed pattern and the first simulation pattern, so as to obtain a first modified pattern, and repeating the application of the rough correction step until the first deviation amount is equal to or less than a predetermined rough criterion, wherein the first modified pattern in the rough correction step is used as the first mask pattern in a next rough correction step;

obtaining a precision corrected mask pattern from the rough corrected mask pattern by applying a precision correction step including a second simulation step to obtain a second simulated pattern of a second mask pattern by using the second simulation model, wherein the rough corrected mask pattern is used as the second mask pattern, and a second pattern modification step to modify the second mask pattern based on a second deviation amount between the designed pattern and the second simulated pattern, so as to obtain a second modified pattern, and repeating the application of the precision correction step until the second deviation amount is equal to or less than a predetermined precision criterion, wherein the second modified pattern in the precision correction step is used as the second mask pattern in a next precision correction step; and outputting the precision corrected mask pattern.

2. The method of claim 1, wherein the rough correction step comprises:

allocating evaluation points on the perimeter of the first mask pattern and partitioning the first mask pattern into edge segments; and simulating a predicted transferred pattern of the first mask pattern as the first simulated pattern at the evaluation points by using the first simulation model and evaluating the first deviation amount.

3. The method of claim 2, wherein the rough criterion is larger than a permissible dimension error that is a difference in dimensions between a designed pattern and a maximum value of a variation allowed for a semiconductor device performance in a fabricated pattern dimension.

4. The method of claim 1, wherein the precision correction step comprises:

allocating evaluation points on a perimeter of the first mask pattern and partitioning the first mask pattern into edge segments; and simulating a predicted transferred pattern of the rough corrected mask pattern as the second simulated pattern by using the second model at the evaluation points and evaluating the second deviation amount.

5. The method of claim 4, wherein the precision criterion is equal to or smaller than a permissible dimension error that is a difference in dimensions between a designed pattern and a maximum value of a variation allowed for a semiconductor device performance in a fabricated pattern dimension.

6. A computer program product tangibly embodied in a computer readable storage medium and configured to execute instructions on a computer, the computer program product comprising:
instructions configured to prepare a designed pattern;
instructions configured to prepare first and second simulation models that simulate transferred images of an exposure apparatus, where a first simulation speed by using the first simulation model is faster than a second simulation speed using the second simulation model for a given mask pattern and exposure apparatus condition;
instructions configured to create a first mask pattern by using data of the designed pattern:
instructions configured to obtain a rough corrected mask pattern from a the first mask pattern, by applying a rough correction step including a first simulation step to obtain a first simulated pattern of the first mask pattern by using the first simulation model, and a first pattern modification step to modify the first mask pattern based on a first deviation amount between the designed pattern and the first simulated pattern, so as to obtain a first modified pattern, and repeating the application of the rough correction step until the first deviation amount is equal to or less than a predetermined rough criterion, wherein the first modified pattern in the rough correction step is used as the first mask pattern in a next rough correction step; and
instructions configured to obtain a precision corrected mask pattern from the rough corrected mask pattern by applying a precision correction step including a second simulation step to obtain a second simulated pattern of a second mask pattern by using the second simulation model, wherein the rough corrected mask pattern is used as the second mask pattern, and a second pattern modification step to modify the second mask pattern based on a second deviation amount between the designed pattern and the second simulated pattern, so as to obtain a second modified pattern, and repeating the application of the precision correction step until the second deviation amount is equal to or less than a predetermined precision criterion, wherein the second modified pattern in the precision correction step is used as the second mask pattern in a next precision correction step; and instructions configured to output the precision corrected mask pattern.

7. A method for producing a photomask, comprising:
preparing a designed pattern;
preparing first and second simulation models that simulate transferred images of an exposure apparatus, where a first simulation speed using the first simulation model is faster than a second simulation speed using the second simulation model for a given mask pattern and exposure apparatus condition;
creating a first mask pattern by using data of the designed pattern;
obtaining a rough corrected mask pattern from the first mask pattern, by applying a rough correction step including a first simulation step to obtain a first simulated pattern of the first mask pattern by using the first simulation model, and a first pattern modification step to modify the first mask pattern based on a first deviation amount between the designed pattern and the first simulated pattern, so as to obtain a first modified pattern, and repeating the application of the rough correction step until the first deviation amount is equal to or less than a predetermined rough criterion, wherein the first modified pattern in the rough correction step is used as the first mask pattern in a next rough correction step;
obtaining a precision corrected mask pattern from the rough corrected mask pattern by applying a precision correction step including a second simulation step to obtain a second simulated pattern of a second mask pattern by using the second simulation model, wherein the rough corrected mask pattern is used as the second mask pattern, and a second pattern modification step to modify the second mask pattern based on a second deviation amount between the designed pattern and the second simulated pattern, so as to obtain a second modified pattern, and repeating the application of the precision correction step until the second deviation amount is equal to or less than a predetermined precision criterion, wherein the second modified pattern in the precision correction step is used as the second mask pattern in a next precision correction step;
loading a mask blank into a lithography system; and
transferring the precision corrected mask pattern on the mask blank.

8. The method of claim 7, wherein the rough correction step comprises:
allocating evaluation points on a perimeter of the first mask pattern and partitioning the first mask pattern into edge segments; and
simulating a predicted transferred pattern of the first mask pattern as the first simulated pattern at the evaluation points by using the first simulation model and evaluating the first deviation amount.

9. The method of claim 8, wherein the rough criterion is larger than a permissible dimension error that is a difference in dimensions between a designed pattern and a maximum value of a variation allowed for a semiconductor device performance in a fabricated pattern dimension.

10. The method of claim 7, wherein the precision correction step comprises:
allocating evaluation points on a perimeter of the first mask pattern and partitioning the first mask pattern into edge segments; and
simulating a predicted transferred pattern of the rough corrected mask pattern as the second simulated pattern by using the second model at the evaluation points and evaluating the second deviation amount.

11. The method of claim 10, wherein the precision criterion is equal to or smaller than a permissible dimension error that is a difference in dimensions between a designed pattern and a maximum value of a variation allowed for a semiconductor device performance in a fabricated pattern dimension.

12. A method for manufacturing a semiconductor device, comprising:
producing a photomask by
preparing a designed pattern,
preparing first and second simulation models that simulate transferred images of an exposure apparatus, where a first simulation speed using the first simulation model is faster than a second simulation speed using the second simulation model for a given mask pattern and an exposure apparatus condition, creating a first mask pattern by using data of the designed pattern, obtaining a rough corrected mask pattern from the first mask pattern by applying a rough correction using the first simulation model, and a first pattern modification step to modify the first mask pattern based on a first deviation amount between the designed pattern and the first simulated pattern, so as to obtain a first modified pattern, and repeating the application of the rough correction step until the first deviation amount is equal to or less than a predetermined rough criterion, wherein the first modified pattern in the rough correction step is used as the first mask pattern in a next rough correction step, obtaining a precision corrected mask pattern from the rough corrected mask pattern by applying a precision correction step including a second simulation step to obtain a second simulated pattern of a second mask pattern by using the second simulation model, wherein the rough corrected mask pattern is used as the second mask pattern, and a second pattern modification step to modify the second mask pattern based on a second deviation amount between the designed pattern and the second simulated pattern, so as to obtain a second modified pattern, and repeating the application of the precision correction step until the second deviation amount is equal to or less than a predetermined precision criterion, wherein the second modified pattern in the precision correction step is used as the second mask pattern in a next precision correction step, loading a mask blank into a lithography system, and transferring the precision corrected mask pattern on the mask blank;

loading a semiconductor substrate coated with a resist film into the exposure apparatus;

projecting light through the photomask on the resist film so as to transfer the precision corrected mask pattern of the photomask on the resist film to form a resist pattern; and forming a circuit pattern on the semiconductor substrate using the resist pattern as a mask, the circuit pattern corresponding to the precision corrected mask pattern.

13. The method of claim 12, wherein the rough correction step comprises:

allocating evaluation points on a perimeter of the first mask pattern and partitioning the first mask pattern into edge segments; and simulating a predicted transferred pattern of the first mask pattern as the first simulated pattern at the evaluation points by using the first simulation model and evaluating the first deviation amount.

14. The method of claim 13, wherein the rough criterion is larger than a permissible dimension error that is a difference in dimensions between a designed pattern and a maximum value of a variation allowed for a semiconductor device performance in a fabricated pattern dimension.

15. The method of claim 12, wherein the precision correction step comprises:

allocating evaluation points on a perimeter of the first mask pattern and partitioning the first mask pattern into edge segments; and simulating a predicted transferred pattern of the rough corrected mask pattern as the second simulated pattern by using the second model at the evaluation points and evaluating the second deviation amount.

16. The method of claim 15, wherein the precision criterion is equal to or smaller than a permissible dimension error that is a difference in dimensions between a designed pattern and a maximum value of a variation allowed for a semiconductor device performance in a fabricated pattern.

17. The method of claim 1, wherein the second simulation model uses more calculation variables than the first simulation model.

18. The method of claim 6, wherein the second simulation model uses more calculation variables than the first simulation model.

19. The method of claim 7, wherein the second simulation model uses more calculation variables than the first simulation model.

20. The method of claim 12, wherein the second simulation model uses more calculation variables than the first simulation model.

* * * * *